United States Patent [19]

Miura et al.

[11] Patent Number: 5,705,425
[45] Date of Patent: Jan. 6, 1998

[54] PROCESS FOR MANUFACTURING SEMICONDUCTOR DEVICES SEPARATED BY AN AIR-BRIDGE

[75] Inventors: Takao Miura; Tunenori Yamauchi; Yoshinobu Monma; Hiroshi Goto, all of Kawasaki, Japan

[73] Assignee: Fujitsu Limited, Kawasaki, Japan

[21] Appl. No.: 638,200

[22] Filed: Apr. 26, 1996

Related U.S. Application Data

[60] Continuation of Ser. No. 295,415, Aug. 25, 1994, abandoned, which is a division of Ser. No. 62,544, May 18, 1993, abandoned.

[30] Foreign Application Priority Data

May 28, 1992 [JP] Japan ................. 4-137099

[51] Int. Cl.⁶ ................. H01L 21/283; H01L 21/58; H01L 21/60; H01L 21/70
[52] U.S. Cl. ................. 437/182; 437/206; 437/226; 437/227
[58] Field of Search ................. 437/182, 206, 437/226, 227, 974; 257/700, 724, 725, 735, 736

[56] References Cited

U.S. PATENT DOCUMENTS

| | | | |
|---|---|---|---|
| 3,761,782 | 9/1973 | Youmans | 317/234 R |
| 3,787,710 | 1/1974 | Cunningham | 257/347 |
| 3,890,632 | 6/1975 | Ham et al. | 357/23 |
| 3,961,354 | 6/1976 | Kuwagata et al. | 357/39 |
| 4,073,055 | 2/1978 | Kimura et al. | 29/583 |
| 4,478,655 | 10/1984 | Nagakubo et al. | 257/352 |
| 4,693,758 | 9/1987 | Kobayashi et al. | 257/352 |
| 4,721,682 | 1/1988 | Graham et al. | 257/509 |
| 4,764,804 | 8/1988 | Sahara et al. | 257/737 |
| 4,966,865 | 10/1990 | Welch et al. | 257/752 |
| 5,036,021 | 7/1991 | Goto | 437/62 |
| 5,104,820 | 4/1992 | Go et al. | 437/51 |
| 5,146,308 | 9/1992 | Chance et al. | 357/55 |
| 5,559,048 | 9/1996 | Inoue | 437/43 |

FOREIGN PATENT DOCUMENTS

| | | |
|---|---|---|
| 0 398 628 | 5/1990 | European Pat. Off. . |
| 2357376 | 6/1974 | Germany . |
| 36 07 093 | 9/1986 | Germany . |
| 38 06 164 | 9/1988 | Germany . |
| 5314560 | 2/1978 | Japan . |
| 57-30336 | 2/1982 | Japan . |
| 57-133647 | 8/1982 | Japan . |
| 2102568 | 10/1988 | Japan . |
| 128825 | 1/1989 | Japan . |
| 1246875 | 10/1989 | Japan . |
| 271546 | 3/1990 | Japan . |
| 2102568 | 4/1990 | Japan . |
| 2219252 | 8/1990 | Japan . |
| 3152967 | 6/1991 | Japan . |

*Primary Examiner*—David Graybill
*Attorney, Agent, or Firm*—Staas & Halsey

[57] ABSTRACT

A process for manufacturing a semiconductor device comprising: a substrate having an insulating layer and a semiconductor layer lying on the insulating layer, the semiconductor layer having been divided to form a plurality of isolated semiconductor lands by trenches extending through the semiconductor layer to the insulating layer; integrated circuits formed on the respective lands; and conductors running above and across the trenches to electrically connect the integrated circuits on the isolated semiconductor lands.

19 Claims, 9 Drawing Sheets

1

PROCESS FOR MANUFACTURING SEMICONDUCTOR DEVICES SEPARATED BY AN AIR-BRIDGE

This application is a continuation of application Ser. No. 08/295,415, filed Aug. 25, 1994, now abandoned, which is a division of application Ser. No. 08/062,544, filed May 18, 1993, now abandoned.

BACKGROUND OF THE INVENTION

1. Field of the Invention

The present invention relates to semiconductor devices fabricated on an insulator/semiconductor composite substrate having an insulating layer and a semiconductor layer lying on the insulating layer, the semiconductor layer divided to form a plurality of isolated semiconductor lands each containing integrated circuits formed therein and electrically connected with other integrated circuits in other semiconductor lands via interland conductors. Such semiconductor devices include those formed either on an SOI (silicon-on-insulator) substrate or on a glass, sapphire or other insulating substrate with a semiconductor layer provided thereon.

The present invention also relates to a process of producing such semiconductor devices.

2. Description of the Related Art

Such insulator/semiconductor composite substrates are represented by SOI substrates, which are fabricated either by bonding two silicon wafers to each other with a silicon oxide (SiO$_2$) layer interposed therebetween, or by an SIMOX process utilizing implantation of oxygen ions and oxidation. One of the silicon wafers serves as a semiconductor layer in which electronic elements are formed to comprise integrated circuits, while the other serves as a mechanical support for the insulating layer and the first silicon wafer.

Glass or sapphire substrates with a semiconductor layer formed thereon are also used as a substrate according to the present invention, although SOI substrates are referred to as a typical case in the following description for simplicity.

When a plurality of integrated circuits, or single electrical elements, such as transistors, are formed on the upper semiconductor or silicon layer of an SOI substrate, isolation between individual semiconductor lands is necessary for mutually isolating or electrically separating integrated circuits to avoid mutual interference therebetween and the noise caused thereby.

The conventional method of isolating integrated circuits between semiconductor lands involves making a V- or U-shaped trench, extending through the upper semiconductor layer to the underlying insulating layer, and filling the trench with an insulating material. For example, FIG. 1 shows an SOI substrate 4 comprising a lower semiconductor layer 1, an SiO$_2$ intermediate insulating layer 2 and an upper semiconductor layer 3, wherein a U-shaped trench, extending through the upper semiconductor layer 3 to the insulating layer 2, is formed in the substrate by a selective etching process to form a plurality of semiconductor lands 5A and 5B. An oxide layer 6 (for example, SiO$_2$) is formed to fill the trench and a protective insulating layer 7 is then formed to cover the oxide layer 6 and the semiconductor lands 5A and 5B entirely. The semiconductor lands 5A and 5B contain integrated circuits formed therein. A conductor or wiring layer 8 (for example, a patterned aluminum layer) is formed on the protective insulating layer 7 to provide interland electrical connection between the integrated circuits of the lands 5A and 5B.

Such conventional semiconductor devices formed on an SOI substrate have the following two major problems.

The first problem is that a crystal defect 9 such as dislocations often occurs in the semiconductor lands 5A and 5B. This crystal defect 9 is caused by the stress 10 exerted on the semiconductor lands 5A and 5B that is induced by the difference in thermal expansion coefficients between the semiconductor lands 5A–5B, the filled oxide layer 6 and the insulating layer 2. Such a crystal defect 9 causes current leakage between electronic elements formed in the lands 5A and 5B, leading to malfunction, increase in power consumption, and degradation of reliability of the semiconductor devices.

The second problem is that the filled oxide layer 6 and the protective insulating layer 7 must be planarized or flattened between the lands and the trenches and this requires extra processing steps and cost. The flatness is necessary for preventing disconnection or reduction in thickness of the wiring which runs above and across the trench. The wiring 8 is typically made of aluminum deposited on the protective insulating layer 7 by vapor deposition or sputtering in a vacuum chamber. The thus-deposited aluminum layer 8 does not have good adhesion to the protective insulating layer 7, and therefore, is occasionally discontinuous or thin at steep steps on the insulating layer 7, i.e., causing poor step coverage. To eliminate such steep steps, the upper most surface of the insulating layer 7 must be planarized prior to forming the aluminum wiring 8.

SUMMARY OF THE INVENTION

The object of the present invention is to provide a semiconductor device and a process of producing same, in which semiconductor lands on an insulating layer in SOI or other insulator/semiconductor composite substrates are mutually isolated while avoiding the occurrence of the crystal defects of the semiconductor layer and ensuring good step coverage without requiring any planarization process.

To achieve the object according to the present invention, there is provided a semiconductor device comprising:

a substrate having an insulating layer and a semiconductor layer lying on the insulating layer, the semiconductor layer having been divided to form a plurality of isolated semiconductor lands by trenches extending through the semiconductor layer to the insulating layer;

integrated circuits formed in the respective lands; and conductors running above and across the trenches to provide interland electrical connection between the integrated circuits of the isolated semiconductor lands.

The conductors may be composed of either metal wires for wire bonding or a metal wiring layer formed in another substrate and a bump interposed between the metal wiring layer and a metal pad of the semiconductor land.

Typically, the substrate is an SOI substrate comprising the insulating layer, the semiconductor layer, and a lower semiconductor layer underlying the insulating layer.

The insulating layer of the substrate may comprise glass or sapphire.

According to the present invention, there is also provided a process of producing a semiconductor device, the process comprising the steps of:

preparing a substrate having a first insulating layer and a semiconductor layer lying on the first insulating layer;

forming a plurality of integrated circuits in the semiconductor layers;

forming isolating trenches extending through the semiconductor layer to the first insulating layer so that the plurality of integrated circuits are separated to form a plurality of isolated semiconductor lands; and electrically connecting the integrated circuits of the semiconductor lands between lands by means of conductors running above and across the trenches.

In one aspect of the present invention, the process comprises the steps of:

forming a second insulating layer which will form interlayer insulating layers underlying uppermost metal wiring layers of the integrated circuits;

forming the isolating trenches extending from the second insulating layer to the first insulating layer;

forming contact holes extending through the second insulating layer to the semiconductor layer;

forming the uppermost metal wiring layers lying on the insulating layer;

forming a protective insulating layer covering the uppermost metal wiring layers and the semiconductor lands entirely;

forming contact windows extending through the protective insulating layer to the semiconductor layer; and electrically connecting the integrated circuits of the isolated semiconductor lands by means of the conductors via the contact windows.

In another aspect of the present invention, the process comprises the steps of:

forming uppermost metal wiring layers of the integrated circuits;

forming a first protective insulating layer on the uppermost metal wiring layers;

forming the isolating trenches extending through the uppermost metal wiring layers to the first insulating layer;

forming a second additional protective insulating layer covering the first protective insulating layer and the isolating trenches;

forming contact windows extending through the second and first protective insulating layers to the uppermost metal wiring layers; and electrically connecting the integrated circuits on the semiconductor lands by means of the conductors via the contact windows.

In a further aspect of the present invention, the process comprises the steps of:

forming uppermost metal wiring layers of the integrated circuits;

forming a first protective insulating layer on the uppermost metal wiring layers;

forming contact holes extending through the first protective insulating layer to the semiconductor layer;

forming the isolating trenches extending through the first protective insulating layer to the first insulating layer; and electrically connecting the integrated circuits of the semiconductor lands by means of the conductors via the contact windows.

The step of electrical connection may be performed either by wire bonding using a metal wire or by metal wiring formed in another substrate.

The step of electrical connection may also be performed by:

preparing another substrate having a metal wiring layer formed thereon;

preparing a bump;

placing the bump between the metal wiring layer and a metal pad of the semiconductor lands; and heating the substrate to fuse the bump, thereby bonding the metal wiring layer to the metal pad through the fused bump.

The process may further comprise the steps of:

doping interland regions of the semiconductor layer with an impurity prior to forming the isolating trenches, the impurity being of the opposite conductivity type with respect to an impurity doped in active regions of electronic elements of the integrated circuits of the semiconductor lands, which electronic elements adjoin the trenches, the interland regions being regions in which the trenches will be formed to form the isolated semiconductor lands later; and forming the isolating trenches in the interland regions so as to leave side walls of the trenches doped with the opposite conductivity type.

The present invention forms a trench extending through the semiconductor layer to the insulating layer lying under the semiconductor layer to define and mutually isolate a plurality of semiconductor lands, as was performed in the conventional art, but does not fill the trench with an insulating material but leaves it as an insulating space, above and across which a conductor runs to interconnect integrated circuits of the neighboring semiconductor lands. This eliminates the necessity of such process steps for planarizing the oxide or insulating layer filled in the trench, such as was conventionally performed, and also prevents occurrence of the crystal defect induced by the filled insulating material.

The conductor for interconnection between the integrated circuits of semiconductor lands may be either a metal wire for wire bonding or comprising a metal wiring layer formed in a second substrate and a bump. This connection conductor according to the present invention eliminates the conventional problem of poor step coverage, because it does not require the forming of a conductor or metal layer on the uneven substrate surface beneath which a trench is buried.

DESCRIPTION OF THE PREFERRED EMBODIMENTS

The preferred embodiments of the present invention will now be described in more detail by way of examples.

EXAMPLE 1

Interland Conductor of Metal Wire by Wire Bonding

Figure 1:
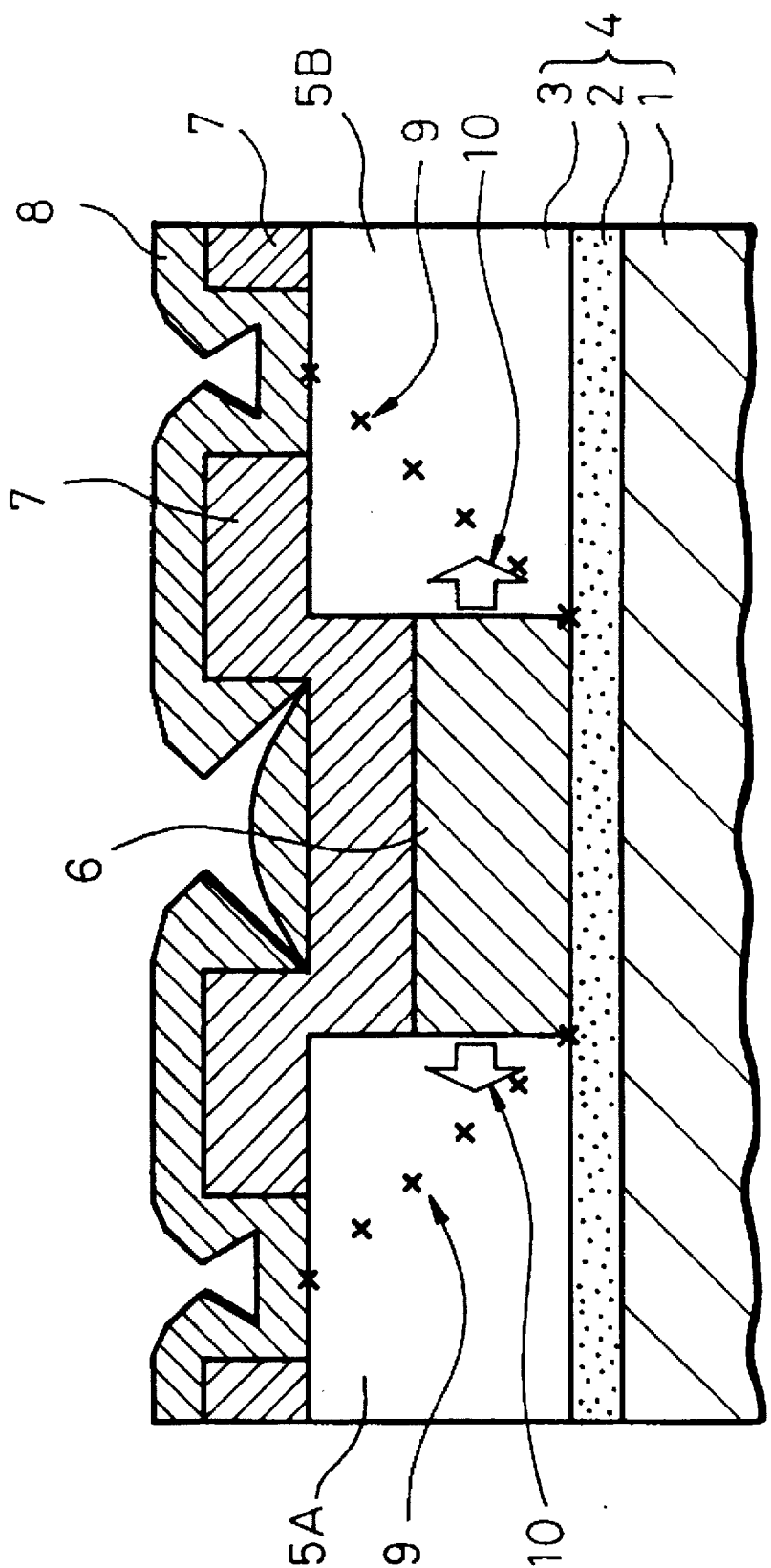
FIG. 1 shows part of a conventional semiconductor device formed on an SOI substrate, in a sectional view.
Figure 2:
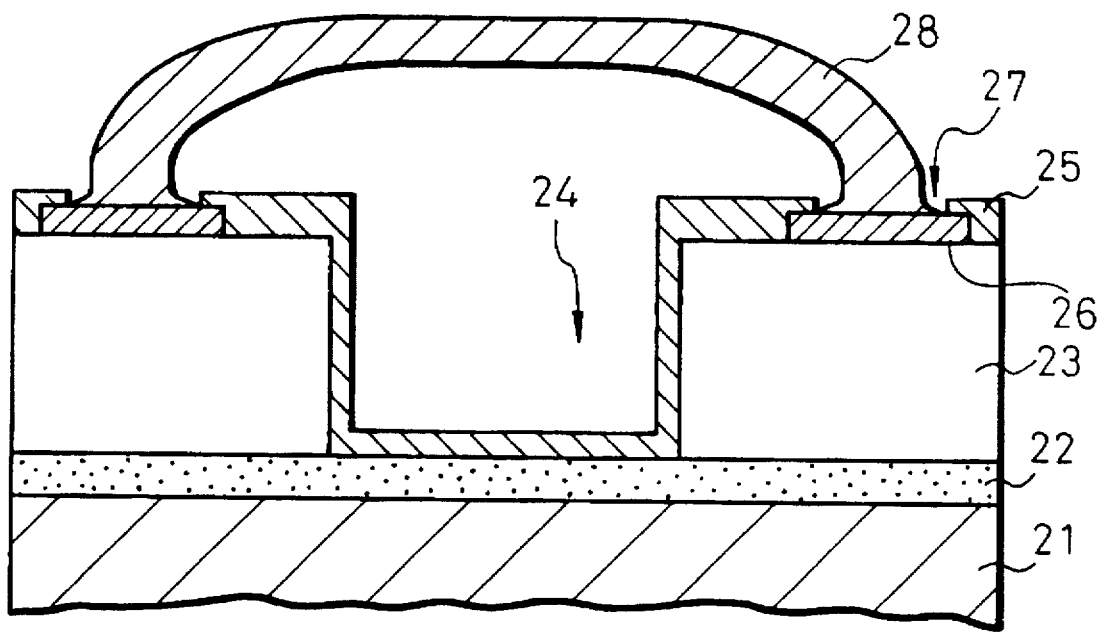
FIG. 2 shows part of a semiconductor device formed on an SOI substrate according to one embodiment of the present invention, in a sectional view.
Figure 3:
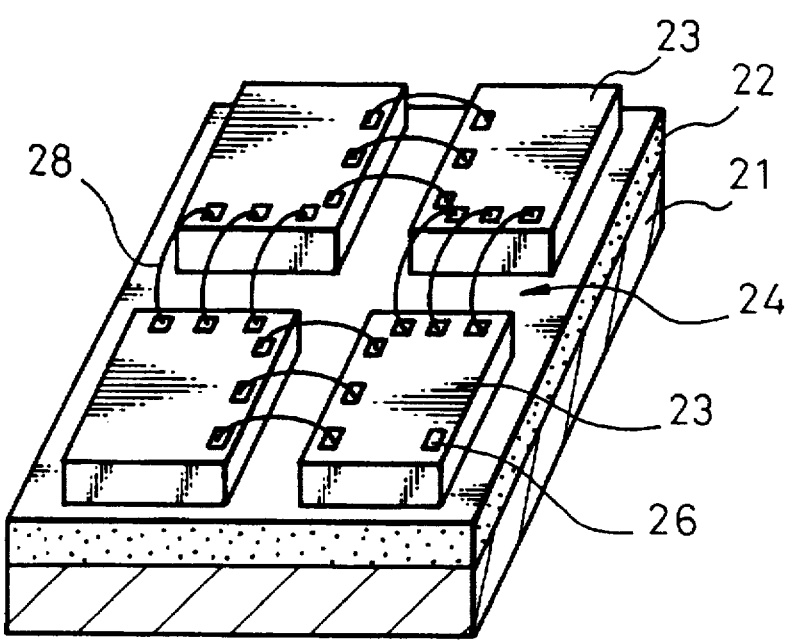
FIG. 3 shows part of the semiconductor device shown in FIG. 2, in a perspective view.

Referring to FIGS. 2 and 3, a semiconductor device fabricated on an SOI substrate has a plurality of isolated semiconductor or silicon lands 23 on an insulating ($SiO_2$) layer 22 on a lower semiconductor (Si) layer 21. The semiconductor lands 23 are formed by selectively etching an upper semiconductor layer of the SOI substrate to form a U- or V-shaped trench 24 extending through the upper semiconductor layer to the insulating layer 22. Each of the semiconductor lands 23 has integrated circuits formed therein and an about 1 μm thick protective insulating layer 25 (FIG. 2), such as $SiO_2$ or PSG (phosphosilicate glass) covers and protects the free surfaces of the semiconductor lands 23 and the insulating layer 22 in the trench 24. Each of the semiconductor lands 23 is provided with a metal pad 26 as an electrical connection terminal formed thereon and a contact hole 27 extends through the protective insulating layer 25 to the metal pad 26. Integrated circuits are interconnected between the semiconductor lands 23 by mutually connecting the metal pads 26 of the semiconductor lands 23 via a metal wire 28 such as aluminum or gold by wire bonding.

EXAMPLE 2

Interland Conductor of Metal Wiring Formed in Another Substrate

Figure 4:
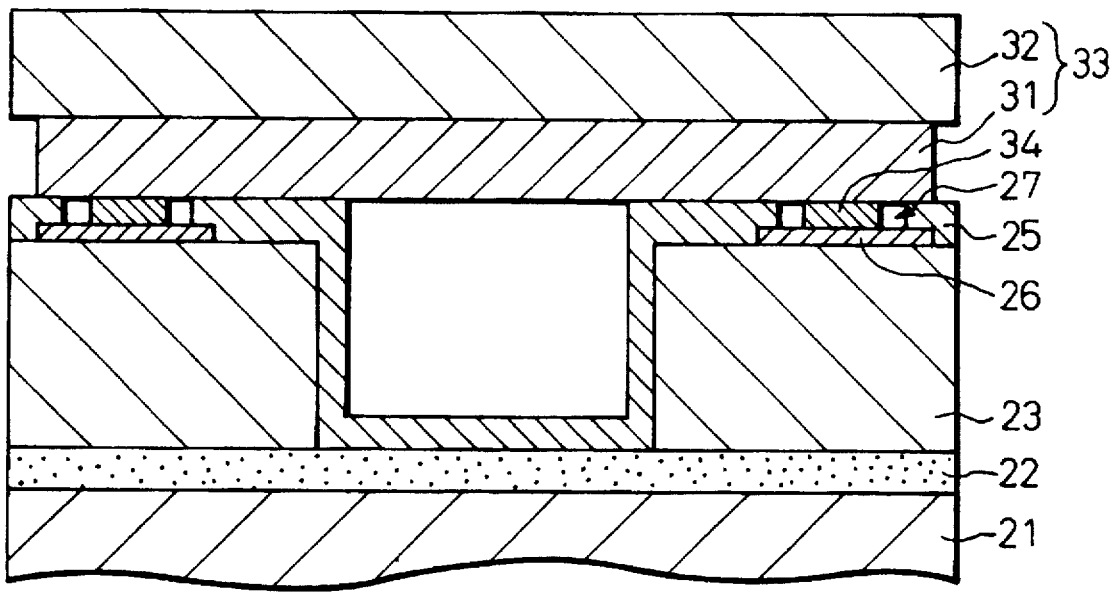
FIG. 4 shows part of a semiconductor device formed on an SOI substrate according to another embodiment of the present invention, in sectional a view.
Figure 5:
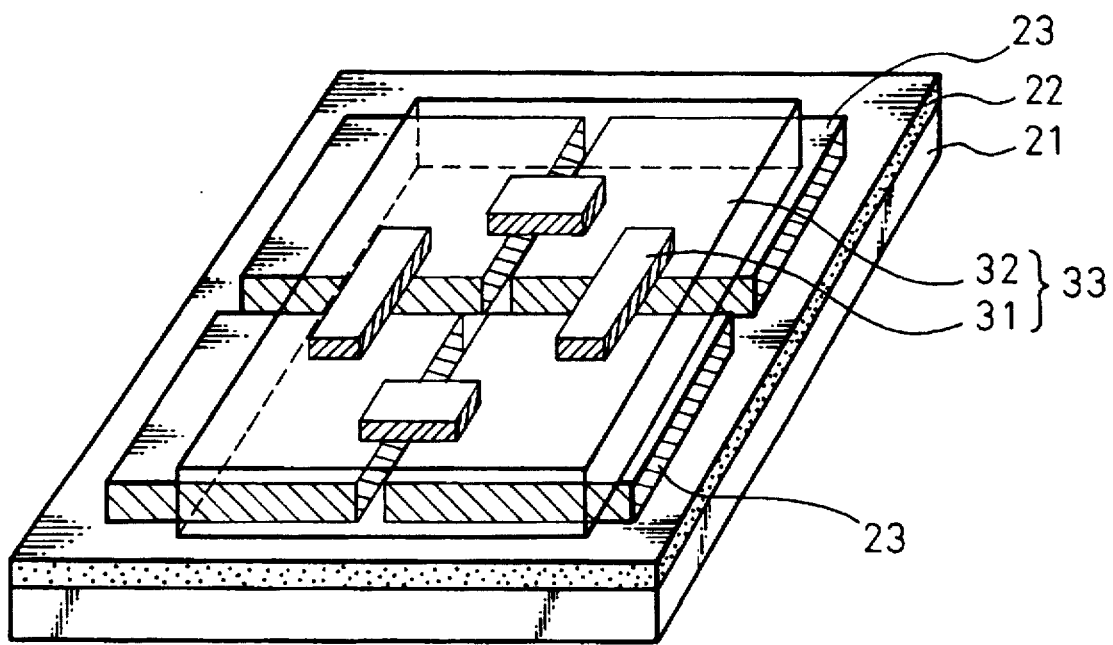
FIG. 5 shows part of the semiconductor device shown in FIG. 4, in a perspective view.

Referring to FIGS. 4 and 5, a semiconductor device fabricated on an SOI substrate has a structure similar to that of Example 1, except that a metal wire by wire bonding 28 is not used, but instead, a metal wiring layer 31 formed on another substrate 32 is used.

The semiconductor device shown in FIGS. 4 and 5 is fabricated by first preparing an SOI substrate having a plurality of semiconductor lands 23 each with a metal pad 26 formed thereon and exposed within a contact hole 27 in a protective insulating layer 25.

A wired substrate 33, separately prepared, has a metal wiring layer 31 with a desired pattern formed on a substrate 32. The wired substrate 33 is a printed circuit board comprising a substrate 32 made of an insulating material and a metal wiring layer 31 of a conductive material such as copper, gold or the like printed on the substrate 32.

The substrate 32 is preferably made of a transparent glass or resin for convenience in properly positioning the substrate 33 with respect to the metal pads 26. A substrate 32 made of an opaque ceramics or resin, however, can be also properly positioned by a camera-aided positioning system or other suitable positioning means.

The substrate 32 may comprise a silicon wafer with an insulating layer ($SiO_2$, PSG, etc.) formed thereon, and the metal wiring layer 31 is provided on the substrate 32. A bump 34 (FIG. 4) of a conductive material such as gold or solder is placed on the metal pad 26 and the above-prepared wired substrate 33 is then placed thereon with the metal wiring layer 31 downward, followed by heating to fuse the bump 34, thereby interconnecting integrated circuits of the semiconductor lands 23 via the patterned metal wiring layer 31 of the substrate 33.

The following examples will demonstrate various process sequences for producing a semiconductor device by using an insulator/semiconductor composite substrate such as an SOI substrate, according to the present invention.

Although the insulator/semiconductor composite substrate is represented by an SOI substrate in the following examples, other composite substrates such as glass or sapphire substrates may be used in quite the same manner.

EXAMPLE 3

Trench Formed After Providing Interlayer Insulating Layer Lying Under Metal Wiring Layer FIGS. 6A to 11 show a process sequence of producing a semiconductor device on an SOI substrate, according to a preferred embodiment of the present invention.

Figure 6A:
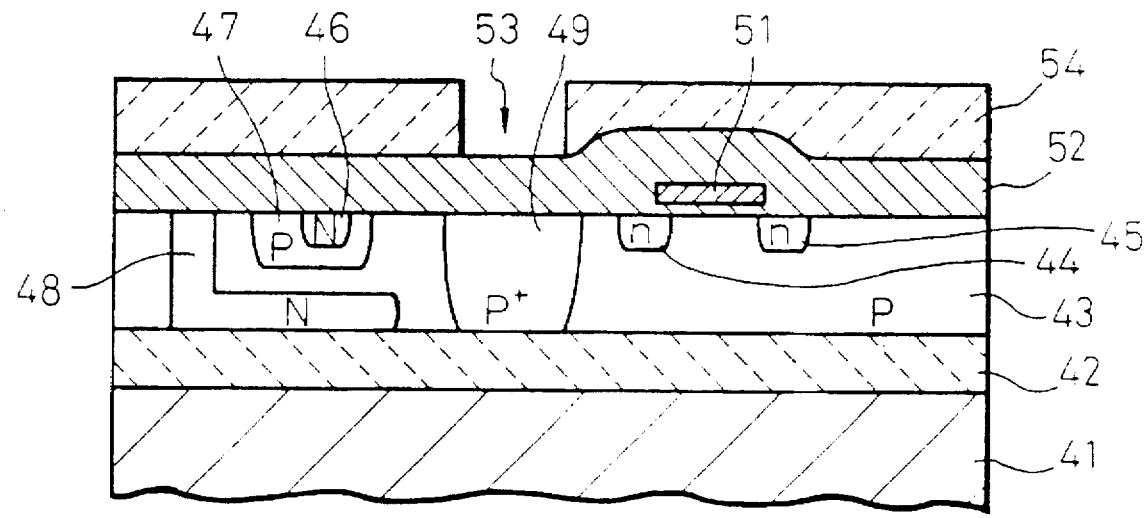
FIG. 6A shows part of a semiconductor device formed on an SOI substrate in an early step of a production process according to the present invention, in a sectional view.

An SOI substrate is prepared by SIMOX process, i.e., by implanting oxygen ions into a single-crystalline silicon wafer. As shown in FIG. 6A this SOI substrate comprises a lower semiconductor layer 41 serving as a mechanical support, an intermediate insulating layer 42 (comprises a 0.5–2 μm thick $SiO_2$ layer), and a p-type upper semiconductor layer 43 (comprises a 2–5μm thick Si layer) in which electronic elements, such as MOS transistors, and bipolar transistors are formed to comprise an integrated circuit. In this example, n-type source/drain regions 44 and 45 of an MOS transistor and an n-type emitter region 46, a p-type base region 47 and an n-type collector region 48 of a bipolar transistor are formed in the upper semiconductor layer 43.

Figure 6B:
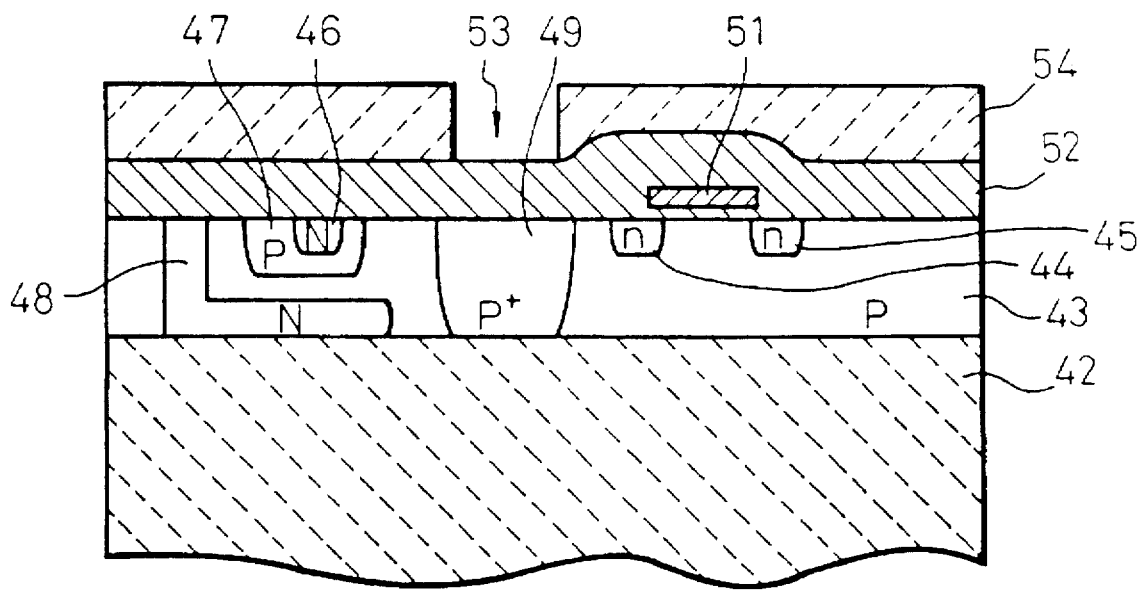
FIG. 6B shows part of a semiconductor device according to the present invention, in the same process step and having the same structure as that of FIG. 6, except for a glass or sapphire substrate being used instead of an SOI, substrate, in sectional view.

Insulating substrates may be also used instead of the SOI substrate (41, 42, 43). For example, FIG. 6B shows a semiconductor device in the same process step and having the same structure as that of FIG. 6A except for the glass or sapphire substrate used instead of an SOI substrate.

A p-type isolation region 49 is formed in the upper semiconductor layer 43 in the sectional portion in which a isolating trench is to be formed. The isolation region 49 has a width greater than that of the trench and extends vertically through the entire thickness of the upper semiconductor layer 43 to the underlying insulating layer 42.

The isolation region 49 is not essential to the present invention, but promotes prevention of current leakage through the side surface of the semiconductor lands when the trench is formed through the isolation region 49 in such a manner that the side edge portions of the isolation region 49 are left on both sides of the trench. To this end, the isolation region 49 is preferably doped in an impurity concentration of not more than $10^{17}$ cm$^{-3}$.

A gate electrode 51 is formed on a gate oxide layer and an interlayer insulating layer 52, such as an about 1 μm thick PSG layer, is then formed to entirely cover the free upper surfaces on the substrate. A resist layer 54, having an aperture 53 with the same pattern as the trench to be formed, is formed on the interlayer insulating layer 52.

Figure 7:
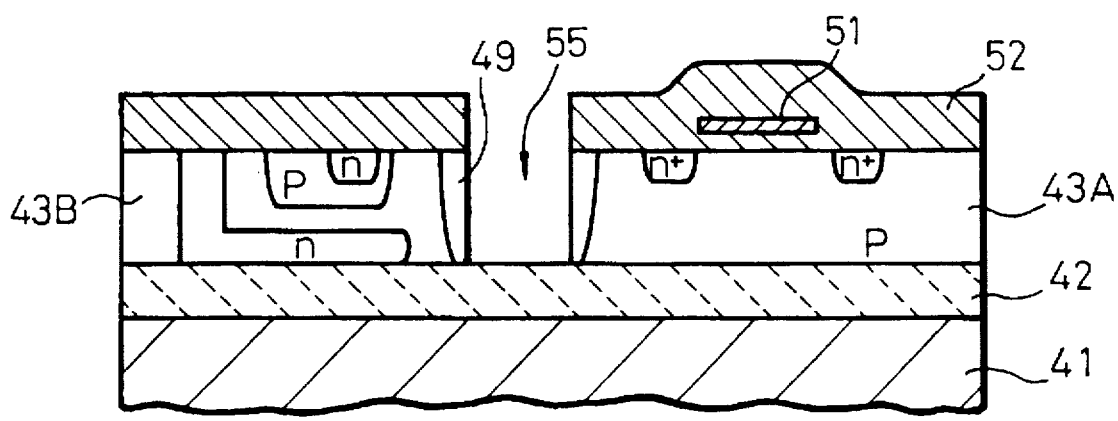
FIG. 7 shows the corresponding part of the semiconductor device of FIG. 6 in a process step subsequent to the process step shown in FIG. 6, according to the present invention, in a sectional view.

The interlayer insulating layer 52 is then selectively etched by using the resist layer 54 as an anti-etching mask, to form an opening therein. By using the interlayer insulating layer 52 as an anti-etching mask, the upper semiconductor (Si) layer 43 is then selectively etched with an etchant such as a KOH solution to form a trench 55, as shown in FIG. 7. The trench 55 extends through the entire thickness of the upper semiconductor layer 43 to the insulating layer 42, thereby dividing the upper semiconductor layer 43 to form a plurality of semiconductor lands 43A and 43B. The isolating trench 55 may be also formed by a dry etching process using Cl$_2$ gas or other etching gases, instead of the wet etching used here. The trench 55 has a V- or U-shaped section. The side walls of the semiconductor lands 43A and 43B are coated with the side edge portions of the p-type isolation region 49 that are left on both sides of the trench 55.

Figure 8:
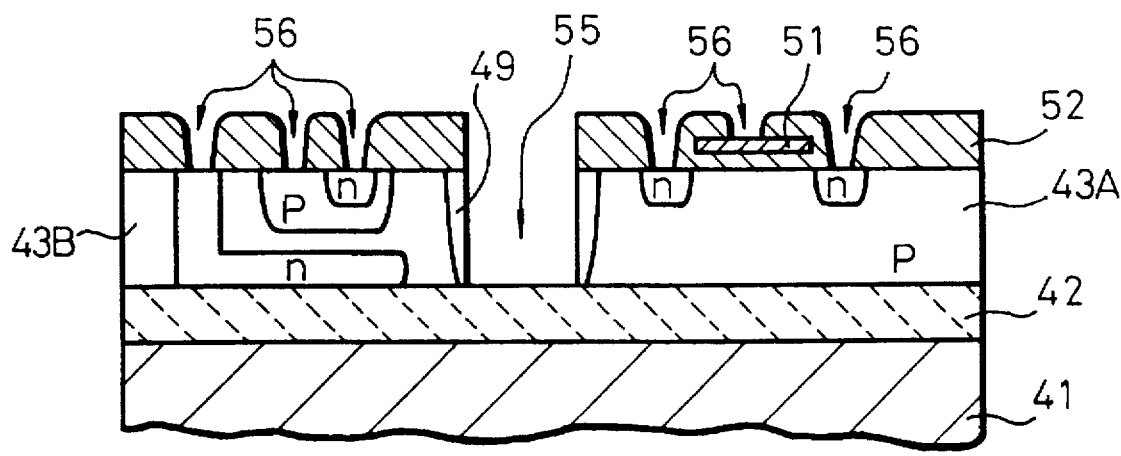
FIG. 8 shows the corresponding part of the semiconductor device of FIG. 7 in a process step subsequent to the process step shown in FIG. 7, according to the present invention, in a sectional view.

As shown in FIG. 8, contact holes 56 are opened through the interlayer insulating layer 52 by the usual photolithography and selective etching processes.

Figure 9:
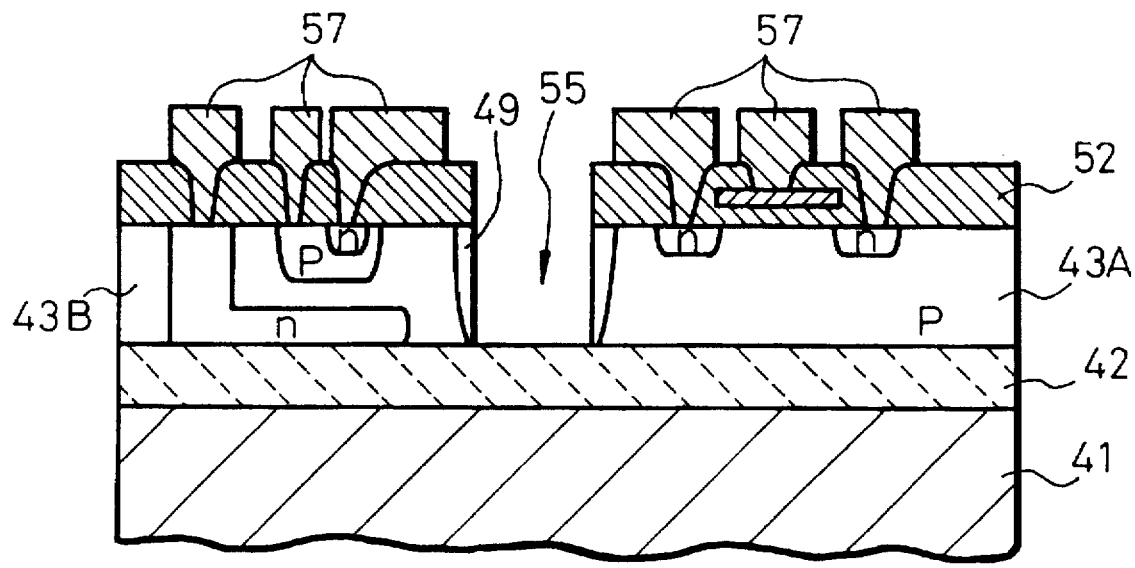
FIG. 9 shows the corresponding part of the semiconductor device of FIG. 8 in a process step subsequent to the process step shown in FIG. 8, according to the present invention, in a sectional view.

Metal wiring or electrodes 57 with a desired pattern are then formed to fill the contact holes 56 and extend onto the interlayer insulating layer 52 as shown in FIG. 9. The wiring 57 is formed by any suitable known process, for example, by forming an aluminum layer by sputtering to coat the entire free upper surface of the substrate and patterning the aluminum layer (about 1 μm thick, for example) by photolithography and selective etching processes.

Figure 10:
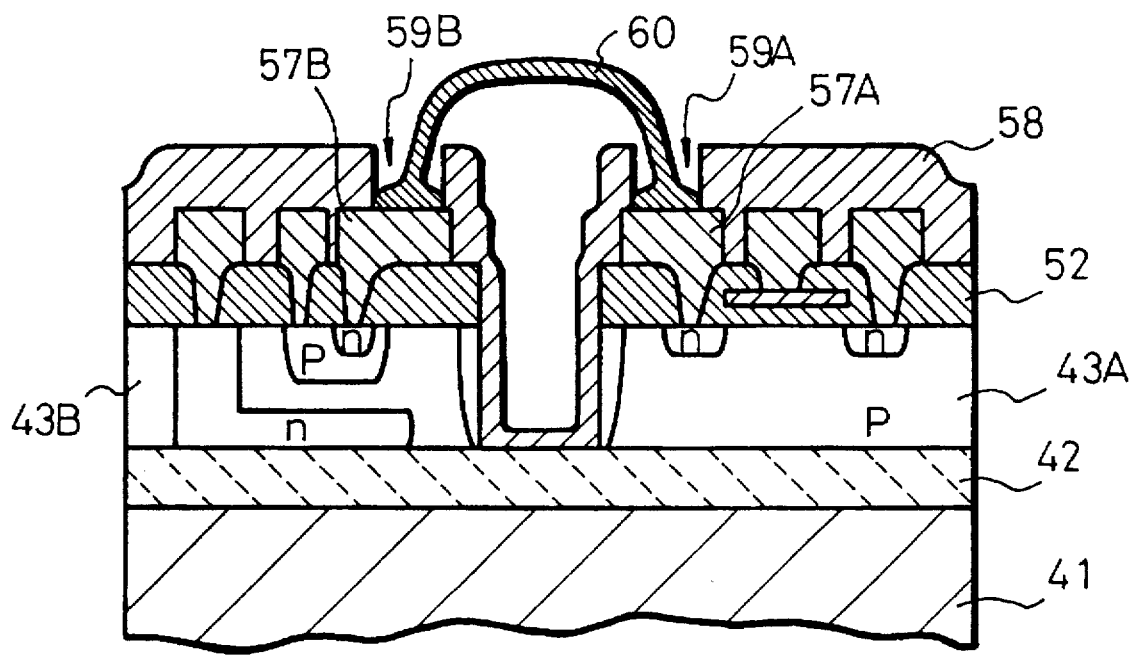
FIG. 10 shows the corresponding part of the semiconductor device of FIG. 9 in a process step subsequent to the process step shown in FIG. 9, for providing a metal wire according to the present invention, in a sectional view.
Figure 11:
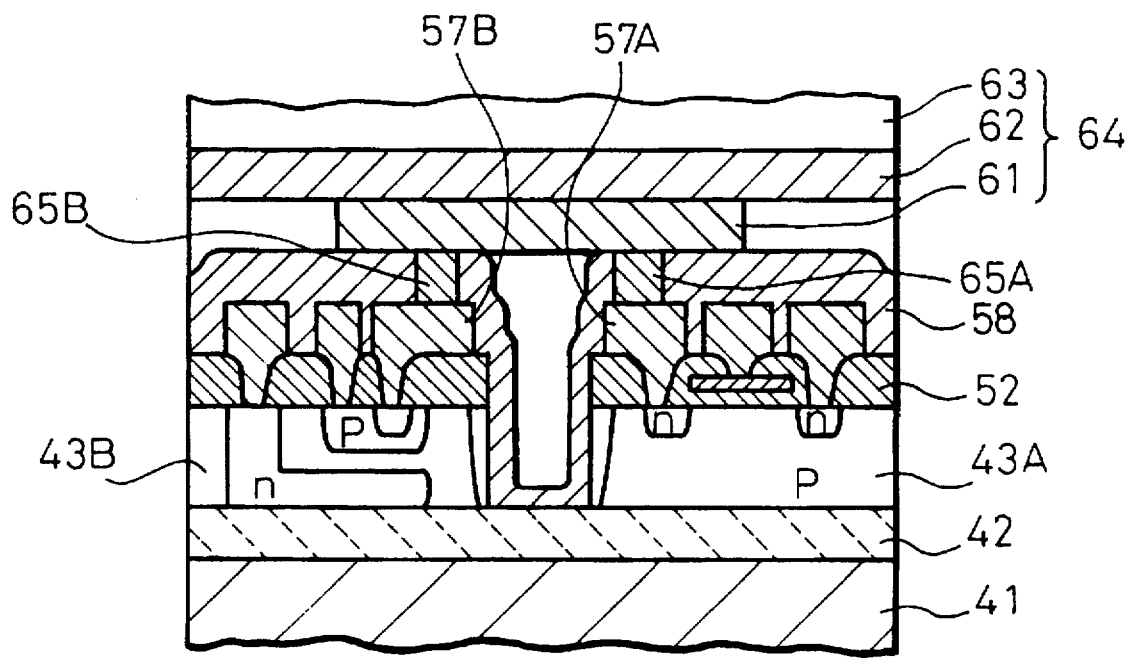
FIG. 11 shows the corresponding part of the semiconductor device of FIG. 9 in a process step subsequent to the process step shown in FIG. 9, for providing a wiring layer formed in another substrate and a bump according to the present invention, in a sectional view.

A protective insulating layer 58, such as an about 1 μm thick PSG layer, is then formed on the entire free upper surface by a CVD process, as shown in FIGS. 10 and 11. Contact holes 59A and 59B are opened by selectively removing the protective insulating layer 58 in the portions above metal pads 57A and 57B of the wiring 57 to provide the terminals for interconnecting integrated circuits. In the embodiment shown in FIG. 11, the contact holes 59A and 59B are filled with bumps 65A and 65B of a conductor metal, respectively.

In the embodiment shown in FIG. 10, metal pads 57A and 57B are interconnected with a metal wire 60 provided by a wire bonding process, to electrically interconnect integrated circuits of the isolated semiconductor lands 43A and 43B, thereby completing a semiconductor device fabricated on an SOI substrate.

In the embodiment shown in FIG. 11, a wired substrate 64, separately prepared, comprises a metal wiring layer 62, an insulating layer, and a silicon substrate 63.

The silicon substrate 63 may contain integrated circuits formed therein. In this case, a three dimensionally assembled semiconductor device will be obtained as a final product.

An insulating layer 62, such as of SiO$_2$ or PSG, is formed on the silicon substrate 63, on which a metal wiring layer 61, such as a Cu pattern coated with Zn, is then formed. When a glass, sapphire or other insulating substrate is used instead, the metal wiring layer 61 is formed directly on such an insulating substrate without providing an insulating layer on the substrate.

Bumps 65A and 65B of a conductive metal are placed in the contact holes 59A and 59B, respectively.

The wired substrate 64 is then placed on the top of the lower assembly, i.e., on the protective insulating layer 58, while positioning the wired substrate 64 so that the metal wiring layer 61 is brought into contact with the bumps 65A and 65B on both ends thereof.

The assembled set is then heated to a temperature of 200° to 400° C. and pressed at a pressure of 50 to 100 g/mm$^2$, to fuse the bumps 65A and 65B and thereby bond the metal wiring layer 61 to the bumps 65A and 65B. This provides a completed semiconductor device fabricated on an SOI substrate in which integrated circuits of a plurality of isolated semiconductor lands are electrically interconnected.

EXAMPLE 4

Dividing Trench Formed After Providing Metal Wiring Layer

Figure 12:
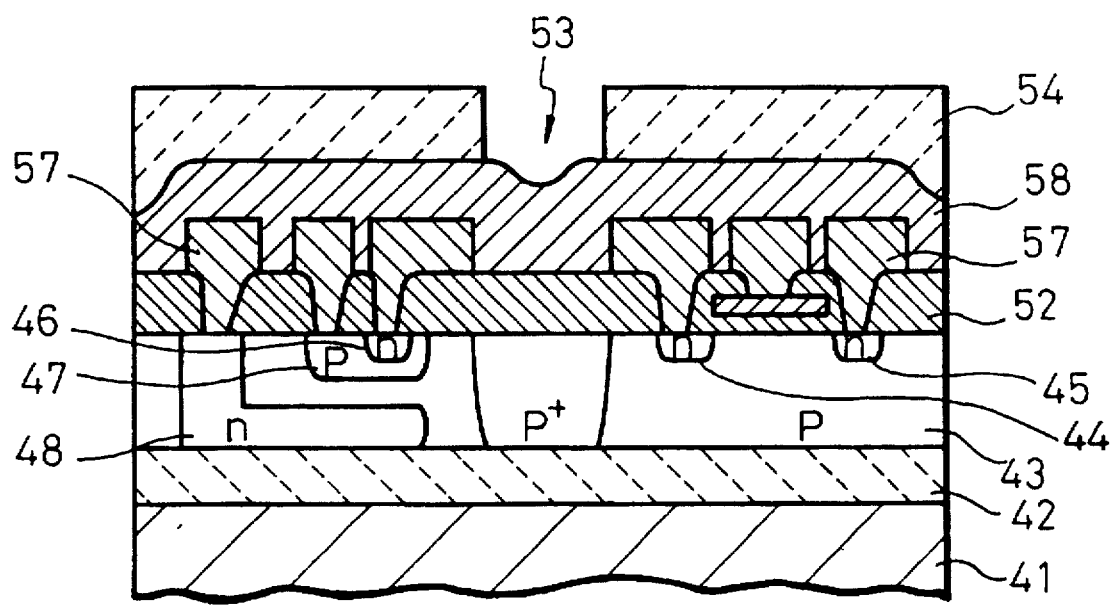
FIG. 12 shows part of a semiconductor device formed on an SOI substrate in another process step following to the process step shown in FIG. 6 according to the present invention, in a sectional view.
Figure 13:
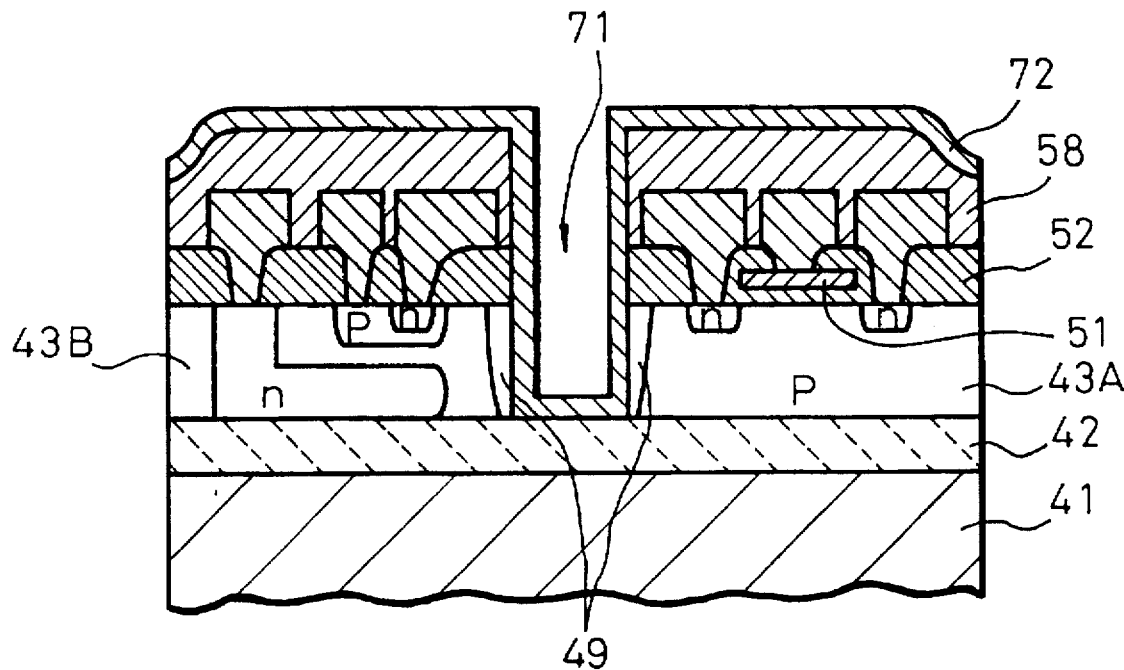
FIG. 13 shows the corresponding part of the semiconductor device of FIG. 12 in a process step subsequent to the process step shown in FIG. 12, according to the present invention, in a sectional view.
Figure 14:
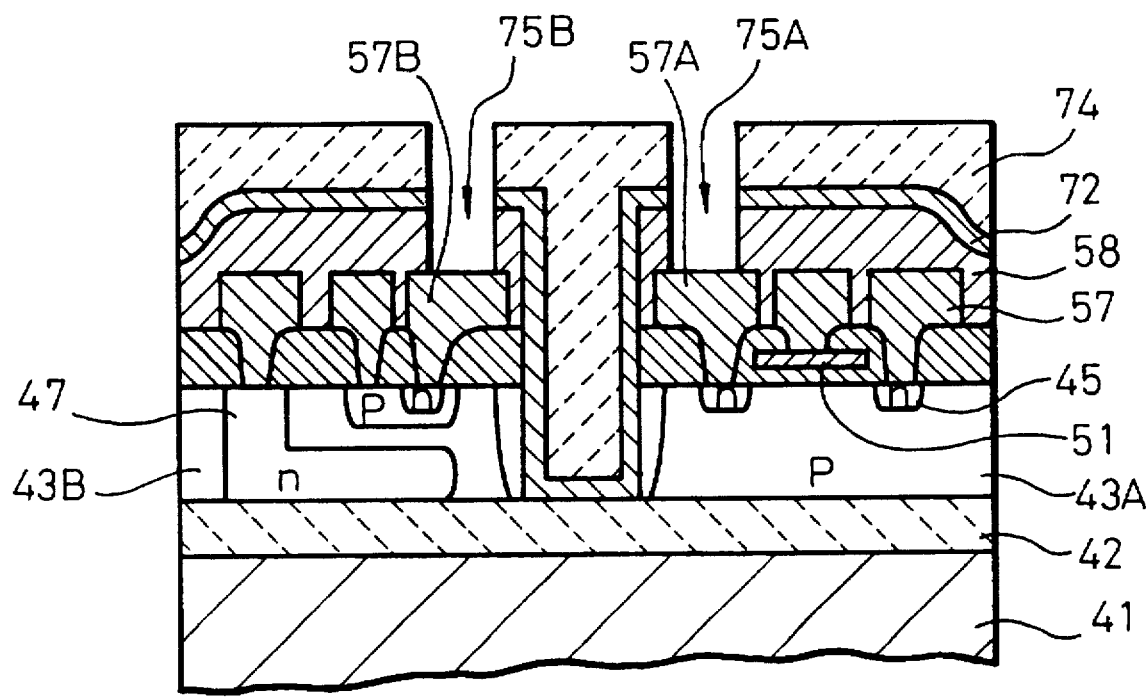
FIG. 14 shows the corresponding part of the semiconductor device of FIG. 13 in a process step subsequent to the process step shown in FIG. 13, according to the present invention, in a sectional view.

FIGS. 12 to 14 show a process sequence of producing a semiconductor device on an SOI substrate, according to another preferred embodiment of the present invention.

An interlayer insulating layer 52 is formed in the same sequence as used in Example 3, as already described by referring to FIG. 6A.

Contact holes are formed in the insulating layer 52 by usual photolithography and selective etching processes, and wiring or electrodes 57 are then formed to fill the contact holes and extend onto the interlayer insulating layer 52. A protective insulating layer 58 is then formed on the entire free upper surface on the substrate. A resist layer 54, having an aperture 53 with the same pattern as the trench to be formed, is formed on the protective insulating layer 58.

The protective and interlayer insulating layers 58 and 52 are then selectively etched to form an opening therein. By using these insulating layers 58 and 52 as an anti-etching mask, the upper semiconductor layer 43 is selectively etched with an etchant solution, such as a KOH solution, to form a trench 71 as shown in FIG. 13. The trench 71 extends vertically through the insulating layers 58 and 52 and the semiconductor layer 43 in the zone of the isolation region 49 down to the insulating layer 42, thereby dividing the semiconductor layer 43 to form a plurality of semiconductor lands 43A and 43B. The isolating trench 71 may be also formed by dry etching instead of wet etching used in this example. The trench 71 has a V- or U-shaped section. The side walls of the semiconductor lands 43A and 43B are coated with the side edge portions of the p-type isolation region 49 that are left on both sides of the trench 71. An additional protective insulating layer 72, such as an about 1 μm thick PSG layer, is formed by a CVD process to cover the entire free surface on the substrate.

Referring to FIG. 14, a resist layer 74, having an aperture with the same pattern as contact holes to be formed later, is formed on the additional protective insulating layer 72. Contact holes 75A and 75B are opened by selectively removing the protective insulating layers 72 and 58 in the portions above the metal pads 57A and 57B of the wiring 57 to provide terminals for interconnecting integrated circuits. The resist layer 74 is then removed.

The metal pads 57A and 57B are interconnected through the contact holes 59A and 59B either via a metal wire 60 provided by a wire bonding process as shown in FIG. 10 or by means of a wired substrate 64 and metal bumps 65A and 65B as shown in FIG. 11, thereby completing a semiconductor device fabricated on an SOI substrate in which integrated circuits of a plurality of isolated semiconductor lands are electrically interconnected.

EXAMPLE 5

Figure 15:
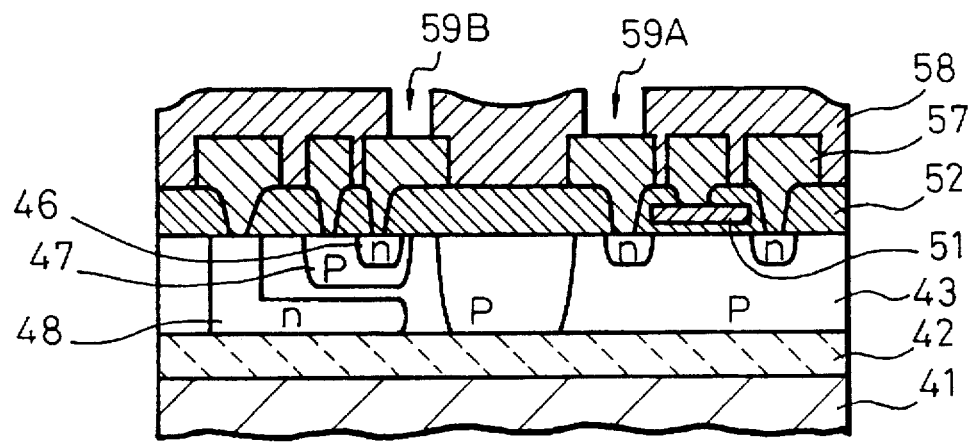
FIG. 15 shows part of a semiconductor device formed on an SOI substrate in a further process step following the process step shown in FIG. 6, according to the present invention, in a sectional view.
Figure 16:
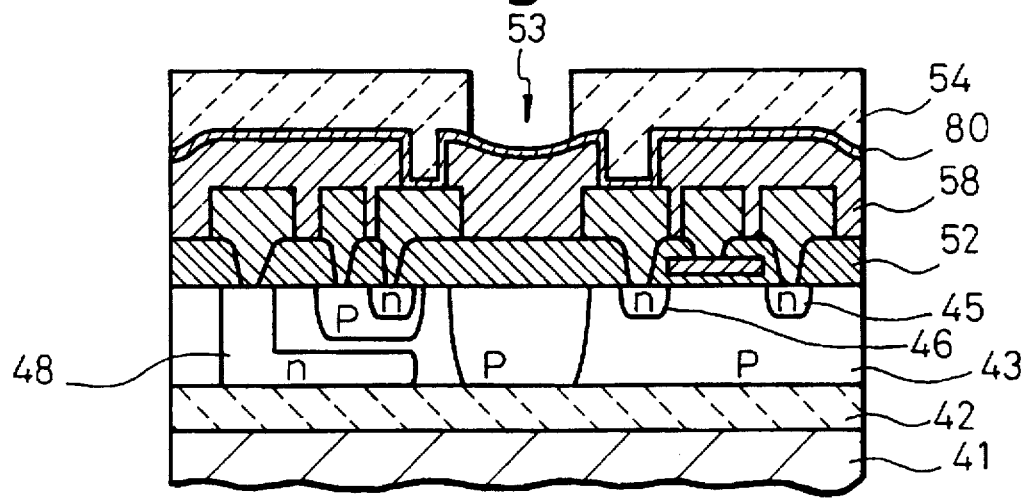
FIG. 16 shows the corresponding part of the semiconductor device of FIG. 15 in a process step subsequent to the process step shown in FIG. 15, according to the present invention, in a sectional view.

Dividing Trench Formed After Providing Protective Insulating Layer on Metal Wiring Layer FIGS. 15 and 16 show a process sequence of producing a semiconductor device on an SOI substrate, according to another preferred embodiment of the present invention.

An interlayer insulating layer 52 is formed in the same sequence as used in Example 3, as already described by referring to FIG. 6A.

Referring to FIG. 15, contact holes are formed in the insulating layer 52 by the usual photolithography and selective etching processes, and wiring or electrodes 57 are then formed to fill the contact holes and extend onto the interlayer insulating layer 52. A protective insulating layer 58 is then formed on the entire free upper surface on the substrate. Contact holes 59A and 59B are opened in the protective insulating layer 58 by photolithography and selective etching processes. This exposes the metal pads 57A and 57B of the metal wiring layer 57 within the contact holes 59A and 59B.

A silicon nitride ($Si_3N_4$) layer 80 is formed on the entire upper surface of the protective insulating layer 58 by a plasma CVD process. A resist layer 54, having an aperture 53 with the same pattern as the trench to be formed, is formed on the silicon nitride layer 80.

Figure 17:
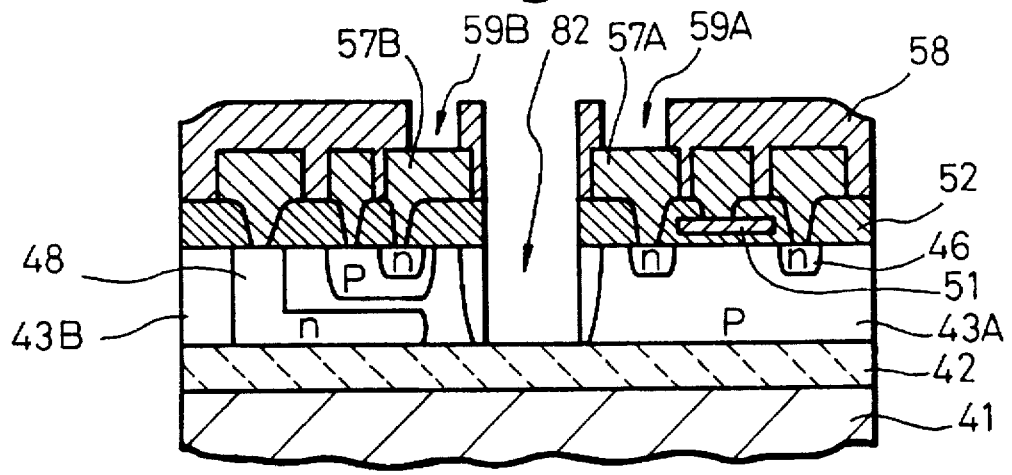
FIG. 17 shows the corresponding part of the semiconductor device of FIG. 16 in a process step subsequent to the process step shown in FIG. 16, according to the present invention, in a sectional view.

The silicon nitride layer 80 is then selectively etched to form an opening therein. By using this silicon nitride layer 80 as an anti-etching mask, the protective insulating layer 58, the interlayer insulating layer 52 and the upper semiconductor layer 43 are selectively etched sequentially in that order to form a trench 82 as shown in FIG. 17. The trench 82 extends vertically through the insulating layers 58 and 52 and the semiconductor layer 43 in the zone of the isolation region 49 down to the insulating layer 42, thereby dividing the semiconductor layer 43 to form a plurality of semiconductor lands 43A and 43B. The silicon nitride layer 80 is then removed.

The trench 82 has a V- or U-shaped section. The side walls of the semiconductor lands 43A and 43B are coated with the side edge portions of the p-type isolation region 49 that are left on both sides of the trench 82.

The metal pads 57A and 57B are interconnected through the contact holes 59A and 59B either via a metal wire 60 provided by wire bonding process as shown in FIG. 10 or by means of a wired substrate 64 and metal bumps 65A and 65B as shown in FIG. 11, thereby completing a semiconductor device fabricated on an SOI substrate in which integrated circuits of a plurality of isolated semiconductor lands are electrically interconnected.

As hereinabove described, the semiconductor device and the process of producing same according to the present invention do not require the surface planarization by filling the isolating trench with an oxide, thereby reducing the process steps while avoiding the occurrence of crystal defects in the semiconductor layer due to the filled oxide. Integrated circuits of semiconductor lands can be advantageously interconnected without requiring the process steps for planarization. The present invention also improves the reliability of the semiconductor devices fabricated on an insulator/semiconductor composite substrate by directly utilizing the advantageous nature of such substrates.

We claim:

1. A process of producing a semiconductor device, said process comprising the steps of:

preparing a substrate having a first insulating layer and a semiconductor layer lying on the first insulating layer;

forming a plurality of integrated circuits in the semiconductor layer;

forming isolating trenches extending through the semiconductor layer to the first insulating layer so that the plurality of integrated circuits are separated and including regions filled with air, to form a plurality of isolated semiconductor lands mechanically connected to each other by the substrate, wherein side walls of said isolating trenches are covered with a diffused layer in the same conductivity type as that of the substrate; and electrically connecting the plurality of integrated circuits of the isolated semiconductor lands by conductors running above and across the regions of the isolating trenches filled with air after said step of forming isolating trenches.

2. A process according to claim 1, further comprising the steps of:

forming a second insulating layer on the semiconductor layer;

forming the isolating trenches extending from the second insulating layer to the first insulating layer;

forming contact holes extending through the second insulating layer to the semiconductor layer;

forming uppermost metal wiring layers on the second insulating layer and extending through ones of the contact holes to the semiconductor layer, the second insulating layer forming an interlayer insulating layer underlying the uppermost metal wiring layers;

forming a protective insulating layer covering the uppermost metal wiring layers and the second insulating layer entirely;

forming contact windows extending through the protective insulating layer to ones of the uppermost metal wiring layers; and electrically connecting the plurality of integrated circuits of the isolated semiconductor lands by the conductors via the contact windows.

3. A process according to claim 1, comprising the steps of:

forming uppermost metal wiring layers of the plurality of integrated circuits, the uppermost wiring layers extending to the semiconductor layer;

forming a first protective insulating layer on the uppermost metal wiring layers;

forming the isolating trenches extending through the uppermost metal wiring layers to the first insulating layer;

forming a second additional protective insulating layer covering the first protective insulating layer and the isolating trenches;

forming contact windows extending through the second and first protective insulating layers to ones of the uppermost metal wiring layers; and electrically connecting the plurality of integrated circuits of the isolated semiconductor lands by the conductors via the contact windows.

4. A process according to claim 1, comprising the steps of:

forming uppermost metal wiring layers of the plurality of integrated circuits, the uppermost metal wiring layer extending to the semiconductor layer;

forming a first protective insulating layer on the uppermost metal wiring layers;

forming contact holes extending through the first protective insulating layer to ones of the uppermost metal wiring layers;

forming the isolating trenches extending through the first protective insulating layer to the first insulating layer; and electrically connecting the plurality of integrated circuits of the isolated semiconductor lands by the conductors via the contact windows.

5. A process according to claim 1, wherein the step of electrically connecting the plurality of integrated circuits is performed by wire bonding using a metal wire.

6. A process according to claim 1, wherein the step of electrically connecting the plurality of integrated circuits is performed by:

preparing another substrate having a metal wiring layer formed thereon;

forming metal pads on ones of the isolated semiconductor lands;

preparing bumps;

placing the bumps between the metal wiring layer and ones of the metal pads of the isolated semiconductor lands; and heating the substrate to fuse the bumps, thereby bonding the metal wiring layer to the ones of the metal pads through the fused bumps.

7. A process according to claim 1, further comprising the steps of:

doping interland regions of the semiconductor layer with an impurity prior to forming the isolating trenches, the impurity being of the opposite conductivity type with respect to an impurity doped in active regions of electronic elements of the plurality of integrated circuits of the isolated semiconductor lands, wherein the electronic elements adjoin ones of the trenches, the interland regions being regions in which the isolating trenches are to be formed, to form the isolated semiconductor lands; and forming the isolating trenches in the interland regions, leaving the side walls of the isolating trenches doped with the impurity of the opposite conductivity type.

8. A process according to claim 1, wherein the substrate is a silicon-on-insulator substrate comprising the insulating layer, the semiconductor layer, and a lower semiconductor layer underlying the insulating layer.

9. A process according to claim 1, wherein the insulating layer of the substrate comprises one of glass and sapphire.

10. A process according to claim 2, wherein the step of electrically connecting the plurality of integrated circuits is performed by wire bonding using a metal wire.

11. A process according to claim 3, wherein the step of electrically connecting the plurality of integrated circuits is performed by wire bonding using a metal wire.

12. A process according to claim 4, wherein the step of electrically connecting the plurality of integrated circuits is performed by wire bonding using a metal wire.

13. A process according to claim 2, wherein the step of electrically connecting the plurality of integrated circuits is performed by:

preparing another substrate having a metal wiring layer formed thereon;

forming metal pads on ones of the isolated semiconductor lands;

preparing bumps;

placing the bumps between the metal wiring layer and ones of the metal pads of the isolated semiconductor lands; and heating the substrate to fuse the bumps, thereby bonding the metal wiring layer to the ones of the metal pads through the fused bumps.

14. A process according to claim 3, wherein the step of electrically connecting the plurality of integrated circuits is performed by:

preparing another substrate having a metal wiring layer formed thereon;

forming metal pads on ones of the isolated semiconductor lands;

preparing bumps;

placing the bumps between the metal wiring layer and ones of the metal pads of the isolated semiconductor lands; and heating the substrate to fuse the bumps, thereby bonding the metal wiring layer to the ones of the metal pads through the fused bumps.

15. A process according to claim 4, wherein the step of electrically connecting the plurality of integrated circuits is performed by:

preparing another substrate having a metal wiring layer formed thereon;

forming metal pads on ones of the isolated semiconductor lands;

preparing bumps;

placing the bumps between the metal wiring layer and ones of the metal pads of the isolated semiconductor lands; and heating the substrate to fuse the bumps, thereby bonding the metal wiring layer to the ones of the metal pads through the fused bumps.

16. A process according to claim 2, further comprising the steps of:

doping interland regions of the semiconductor layer with an impurity prior to forming the isolating trenches, the impurity being of the opposite conductivity type with respect to an impurity doped in active regions of electronic elements of the plurality of integrated circuits of the isolated semiconductor lands, wherein the electronic elements adjoin ones of the trenches, the interland regions being regions in which the isolating trenches, are to be formed, to form the isolated semiconductor lands; and forming the isolating trenches in the interland regions, leaving the side walls of the trenches doped with the impurity of the opposite conductivity type.

17. A process according to claim 3, further comprising the steps of:

doping interland regions of the semiconductor layer with an impurity prior to forming the isolating trenches, the impurity being of the opposite conductivity type with respect to an impurity doped in active regions of electronic elements of the plurality of integrated circuits of the isolated semiconductor lands, wherein the electronic elements adjoin ones of the trenches, the interland regions being regions in which the isolating trenches, are to be formed, to form the isolated semiconductor lands; and forming the isolating trenches in the interland regions, leaving the side walls of the trenches doped with the impurity of the opposite conductivity type.

18. A process according to claim 4, further comprising the steps of:

doping interland regions of the semiconductor layer with an impurity prior to forming the isolating trenches, the impurity being of the opposite conductivity type with respect to an impurity doped in active regions of electronic elements of the plurality of integrated circuits of the isolated semiconductor lands, wherein the electronic elements adjoin ones of the trenches, the interland regions being regions in which the isolating trenches, are to be formed, to form the isolated semiconductor lands; and forming the isolating trenches in the interland regions, leaving the side walls of the trenches doped with the impurity of the opposite conductivity type.

19. A process of producing a semiconductor device, said process comprising the steps of:

preparing a substrate having an insulating layer and a semiconductor layer lying on the insulating layer;

forming a plurality of integrated circuits in the semiconductor layer;

forming isolating trenches through the semiconductor layer and down to the insulating layer, to separate the plurality of integrated circuits, the plurality of integrated circuits being mechanically connected to each other by the substrate, wherein side walls of said isolating trenches are covered with a diffused layer in the same conductivity type as that of the substrate;

electrically connecting the separated plurality of integrated circuits with metal connectors running above and across the isolating trenches after said step of forming isolating trenches, wherein the isolating trenches have respective insulating spaces filled only with air.

* * * * *